United States Patent
Pinos et al.

(10) Patent No.: US 12,255,222 B2
(45) Date of Patent: Mar. 18, 2025

(54) LED ARRAY AND METHOD OF FORMING A LED ARRAY

(71) Applicant: PLESSEY SEMICONDUCTORS LIMITED, Plymouth (GB)

(72) Inventors: Andrea Pinos, Plymouth (GB); Xiang Yu, Plymouth (GB); Simon Ashton, Plymouth (GB); Jonathan Shipp, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 437 days.

(21) Appl. No.: 17/632,281

(22) PCT Filed: Jul. 24, 2020

(86) PCT No.: PCT/EP2020/071024
§ 371 (c)(1),
(2) Date: Feb. 2, 2022

(87) PCT Pub. No.: WO2021/023532
PCT Pub. Date: Feb. 11, 2021

(65) Prior Publication Data
US 2022/0293673 A1 Sep. 15, 2022

(30) Foreign Application Priority Data

Aug. 6, 2019 (GB) ...................................... 1911246

(51) Int. Cl.
*H01L 27/15* (2006.01)
*H01L 23/485* (2006.01)
(52) U.S. Cl.
CPC .......... *H01L 27/156* (2013.01); *H01L 23/485* (2013.01)
(58) Field of Classification Search
CPC ............................ H01L 23/485; H01L 27/156
(Continued)

(56) References Cited

U.S. PATENT DOCUMENTS 5,963,568 A 10/1999 Paoli
11,152,537 B2 10/2021 Kim
(Continued)

OTHER PUBLICATIONS

Great Britain Search Report, Application No. GB1911246.5, dated Jan. 30, 2020, 5 pages.
(Continued)

*Primary Examiner* — Igwe U Anya
(74) *Attorney, Agent, or Firm* — Stinson LLP

(57) ABSTRACT

A Light Emitting Diode (LED) array precursor is provided. The LED array precursor comprises a substrate having a substrate surface, a first LED stack, a p++ layer, a n++ layer and a second LED stack. The first LED stack is provided on a first portion of the substrate surface. The first LED stack comprises a plurality of first Group III-nitride layers defining a first semiconductor junction configured to output light having a first wavelength wherein a n-type side of the first semiconductor junction is orientated towards the substrate surface. The p++ layer is provided on the first LED stack, the p++ layer comprising a Group III-nitride. The n++ layer has a first portion covering the p++ layer of the first LED stack and a second portion covering a second portion of the substrate surface, wherein a tunnel junction is formed at an interface between the n++ layer and the p++ layer, the n++ layer comprising a Group III-nitride. The second LED stack is provided on the second portion of the n++ layer covering the second portion of the substrate surface. The second LED stack comprises a plurality of second Group III-nitride layers defining a second semiconductor junction configured to output light having a second wavelength different to the first wavelength, wherein a n-type side of the semiconductor junction is provided towards the n++ layer. A method of manufacturing a LED array precursor is also provided.

24 Claims, 9 Drawing Sheets

(58) Field of Classification Search
USPC .......................................................... 257/89
See application file for complete search history.

(56) References Cited

U.S. PATENT DOCUMENTS

| | | | |
|---|---|---|---|
| 2016/0111594 A1* | 4/2016 | Nagel | H01L 33/08 |
| | | | 257/13 |
| 2017/0025567 A1 | 1/2017 | Lu et al. | |
| 2017/0213868 A1* | 7/2017 | Damilano | H01L 27/156 |
| 2018/0047868 A1* | 2/2018 | David | H01L 33/025 |
| 2018/0342646 A1* | 11/2018 | Uzawa | H01L 33/30 |
| 2018/0343646 A1* | 11/2018 | Chou | H04W 16/14 |
| 2019/0164945 A1* | 5/2019 | Chae | H01L 33/62 |
| 2019/0198709 A1* | 6/2019 | Wildeson | H01L 33/50 |
| 2021/0020686 A1* | 1/2021 | Kishino | H01L 33/0075 |

OTHER PUBLICATIONS

Taiwanese Search Report, Application No. 109125969, dated May 14, 2021, 8 pages.
International Search Report, PCT/EP2020/071024, dated Oct. 10, 2020, 3 pages.
Written Opinion, PCT/EP2020/071024, dated Oct. 10, 2020, 8 pages.

* cited by examiner

First selective area growth of blue active region

First selective area growth of green active region

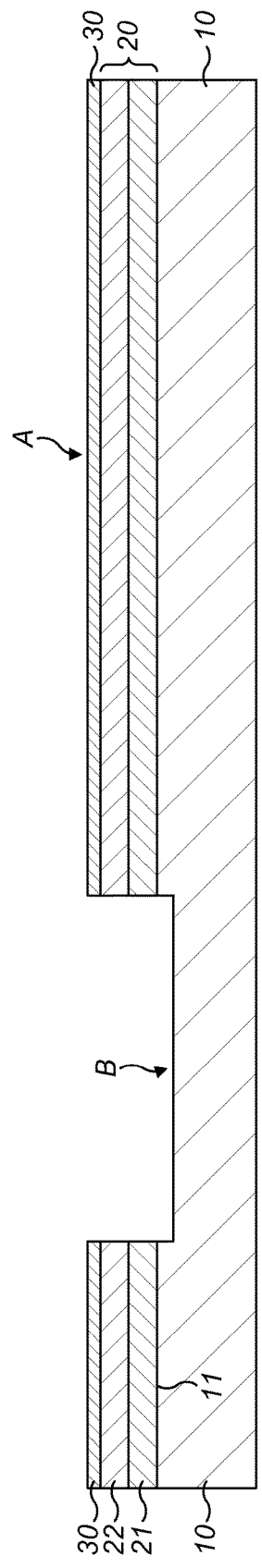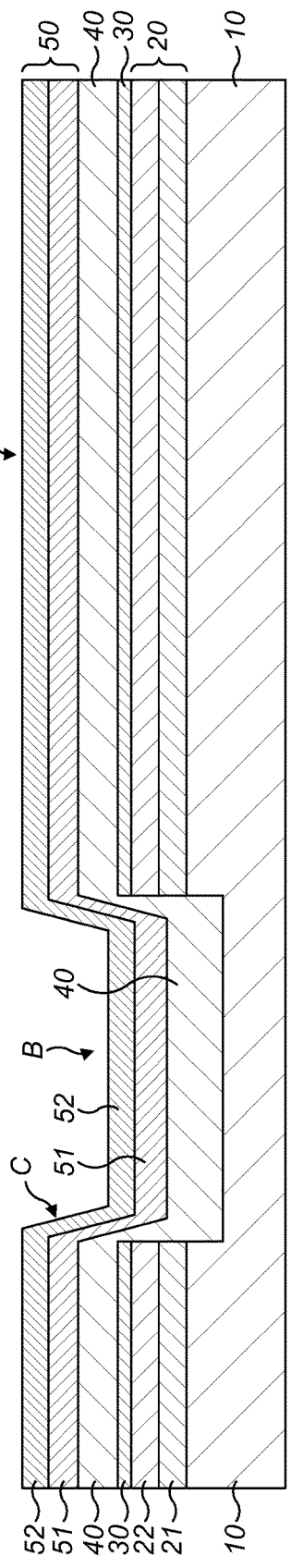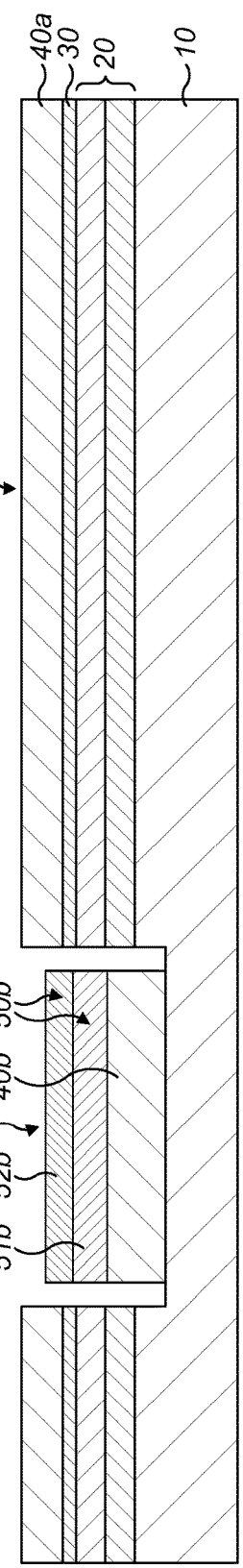

LED ARRAY AND METHOD OF FORMING A LED ARRAY

REFERENCE TO RELATED APPLICATIONS

This application is the 371 U.S. national stage application of International Patent Application No. PCT/EP2020/071024, filed Jul. 24, 2020, which claims the benefit of Great Britain Patent Application No. 1911246.5, filed Aug. 6, 2019, the entire disclosures of which are incorporated herein by reference.

FIELD OF THE DISCLOSURE

The present disclosure relates to LED arrays and methods for forming LED arrays. In particular, the present disclosure relates to LED arrays comprising Group III-nitrides.

BACKGROUND

Monolithic micro-LED arrays are well suited for the production of very high resolution displays with small pitch where pick-and-place fabrication methods are unfavourable due to yield and throughput constraints. Techniques for fabricating efficient single colour (blue) GaN monolithic micro-LED arrays are known in the art. To produce a full-colour micro-LED based-display requires the integration of red and green sub-pixels into the display.

One method for forming full-colour displays is to provide an LED array comprising a plurality of different LEDs each configured to output one or e.g. red, green and blue light. If the full colour spectrum is generated directly by electroluminescence rather than through the use of colour converting materials such as phosphors or quantum dots, such LED arrays are commonly known as 'native' LED arrays.

Native multiple colour LED arrays can be formed by multiple selective-area-growth (SAG) deposition steps. This method is challenging because the growth conditions of sub-pixels formed in a SAG step are severely influence by the local surroundings (i.e. deposition parameters are highly geometry dependent). Hence, the growth parameters for forming a plurality of native LEDs by SAG need to be tailored to the specific mask layout. Thus, small changes in display/LED geometry may require all the SAG to be recalibrated. For example, a SAG process is disclosed in GB 1811109.6. in which a first LED with a blue light active region is selectively formed on a first region of a GaN substrate, as shown in FIG. 1a. The first LED with the blue light active region is then coated with a $SiO_2$ mask layer. Subsequently, a second LED with a green light active region is selectively formed on a second region of the GaN substrate by a subsequent SAG deposition step, as shown in FIG. 1b.

SAG fabrication of LEDs may lead to non-uniform compositions across single sub-pixels for medium to large pixel dimensions. This in turn leads to broad emission wavelengths, which reduces the colour purity of the display. Furthermore, the mask materials used in the SAG process may potentially lead to contamination of the active region with unwanted impurities, for example as noted in US 2004/0129929 A1. Thus, the $SiO_2$ mask layer in FIG. 1 may lead to contamination of the second LED.

Finally, it has been observed that p-type GaN surfaces in masked regions of an LED array may decompose during subsequent high temperature deposition of following LED junctions, thereby compromising the anode contact to junctions deposited in earlier steps. This limits the process window for the deposition of the following LED junctions.

It is an object of the present invention to provide an improved method of forming a LED array which tackles at least one of the problems associated with prior art methods or, at least, provide a commercially useful alternative thereto.

SUMMARY

The present inventors have realised that when forming a LED array it is desirable to use geometry independent deposition processes. For example, deposition processes in which layers are deposited across a substrate and subsequently patterned (e.g. via etching) may be considered to be geometry independent. However, the present inventors have realised that one problem associated with patterning Group III-nitride LED arrays is that terminating an etching process on a p-type semiconducting Group III-nitride will compromise the conductivity of the p-type material, for example as noted in Journal of The Electrochemical Society, 150 (9) G513-G519 (2003)].

Thus, according to a first aspect of the disclosure, a method of forming an LED array is provided. The method comprises:
(a) forming a first LED stack on a substrate surface of a substrate, the first LED stack comprising a plurality of first Group III-nitride layers defining a first semiconductor junction configured to output light having a first wavelength, wherein a n-type side of the semiconductor junction is orientated towards to the substrate surface;
(b) forming a p++ layer on the first LED stack, the p++ layer comprising a Group III-nitride;
(c) forming a n++ layer over the substrate to cover the p++ layer, wherein a tunnel junction is formed at an interface between the n++ layer and the p++ layer, the n++ layer comprising a Group III-nitride;
(d) forming a second LED stack on the n++ layer; the second LED stack comprising a plurality of second Group III-nitride layers defining a second semiconductor junction configured to output light having a second wavelength different to the first wavelength, wherein a n-type side of the second semiconductor junction is provided closest to the n++ layer,
wherein the method further comprises a step of:
selectively removing a portion of the first LED stack and a portion of the second LED stack on the substrate surface in order to define:
a first portion of the LED array in which the second LED stack is selectively removed comprising:
a first portion of the first LED stack;
a first portion of the p++ layer; and
a first portion of the n++ layer such that a tunnel junction is provided on the first portion of the first LED stack; and
a second portion of the LED array comprising:
a second portion of the n++ layer; and
a first portion of the second LED stack provided on the second portion of the n++ layer.

The method according to the first aspect provides a method for forming two different native LEDs on a substrate. By contrast to prior art methods, the method of the first aspect allows for the formation of each of the first and second LED stacks across a substrate, followed by a selective removal step. Accordingly, the first and second LED stacks may be grown on the substrate independently of the geometry of the LEDs to be formed. Thus, the method according to the first aspect may be used for a range of different device geometries without the need to calibrate processing methods for forming the first and second LED stacks when the device geometry is changed.

As noted above, one problem with selectively removing a portion of an LED stack is that a selective removal process may not be terminated on a p-type semiconducting layer. In the method of the first aspect, a tunnel junction is provided on top of the first LED stack such that the first LED stack is not terminated with a p-type semiconducting Group III-nitride.

Thus, the subsequent deposition and removal of the second LED stack over the first LED stack does not compromise the conductivity of the first p-type layer of the first LED stack. Accordingly, the method according to the first aspect allows for different native LEDs (first and second LED stacks) to be monolithically formed on the same substrate using geometry independent processes.

Importantly, the method according to the first aspect does not involve the formation of any of the layers of the first and second LED stacks on a mask layer. Accordingly, the method according to the first aspect reduces or eliminates problems associated with mask layer contamination (for example Si or O contamination of the LED stack layers).

As such, the method according to the first aspect may comprise:
(a) forming a first LED stack on a substrate surface of a substrate, the first LED stack comprising a plurality of first Group III-nitride layers defining a first semiconductor junction configured to output light having a first wavelength, wherein a n-type side of the semiconductor junction is orientated towards to the substrate surface;
(b) forming a p++ layer on the first LED stack, the p++ layer comprising a Group III-nitride;
(c) forming a n++ layer over the substrate to cover the p++ layer, wherein a tunnel junction is formed at an interface between the n++ layer and the p++ layer, the n++ layer comprising a Group III-nitride;
(d) forming a second LED stack on the n++ layer; the second LED stack comprising a plurality of second Group III-nitride layers defining a second semiconductor junction configured to output light having a second wavelength different to the first wavelength, wherein a n-type side of the semiconductor junction is provided closest to the n++ layer,
(e) selectively removing a portion of the second LED stack on the substrate surface
wherein the method further comprises a step of:
selectively removing a portion of the first LED stack before the formation of n++ layer, or after the formation of the second LED stack in order to define:
a first portion of the LED array in which the second LED stack is selectively removed comprising:
  a first portion of the first LED stack;
  a first portion of the p++ layer; and
  a first portion of the n++ layer such that a tunnel junction is provided on the first portion of the first LED stack; and
a second portion of the LED array comprising:
  a second portion of the n++ layer; and
  a first portion of the second LED stack provided on the second portion of the n++ layer.

In some embodiments, the p++ layer may be subjected to one or more surface treatment processes prior to the formation of the n++ layer. For example, the p++ layer may be subjected to an annealing step prior to the formation of the n++ layer. The annealing step may be provided to increase the activation of the acceptor ions in the p++ layer (e.g. Mg ions). The p++ layer may be subjected to a surface treatment process in which the p++ layer is exposed to BHF. The BHF treatment may counteract a concentration of acceptor ions formed near the surface of the p++ layer on which the n++ layer is to be formed. By applying one or more surface treatment processes to the p++ layer, a resistance of the tunnel junction formed between the n++ layer and the p++ layer may be reduced. As such, the deposition of the p++ layer and the n++ layer may take place in two different depositions steps separated by an ex-situ surface treatment step. Such a method may reduce or prevent the diffusion of acceptor ions (e.g. Mg) from the p++ layer to the n++ layer.

In some embodiments, the first LED stack comprises a first n-type layer provided on the substrate surface, a first active layer configured to generate light having the first wavelength provided on the first n-type layer; and a first p-type layer provided on the first active layer. Each of the layers of the first LED stack may comprise Group III-nitrides. Each of the layers may be formed as a substantially continuous layer.

In some embodiments, the second LED stack comprises a second n-type layer provided on the n++ layer, a second active layer configured to generate the light having a second wavelength provided on the second n-type layer, wherein the second wavelength is different to the first wavelength, and a second p-type layer provided on the second active layer. Each of the layers of the second LED stack may comprise Group III-nitrides. Each of the layers of the second LED stack may be formed as a substantially continuous layer.

In some embodiments, the first active layer of the first LED stack comprises a first multiple quantum well laminate configured to output light of the first wavelength, and the second active layer of the second LED stack comprises a second multiple quantum well laminate configured to output light of the second wavelength. As such, the first and second active layers of the LED array may be configured to provide two different native LEDs outputting light having first and second wavelengths respectively. The same concept can be extended to further include a third active region having a third emission wavelength.

In some embodiments, the first LED stack comprises a first strain relaxing laminate provided between the first n-type layer and the first active layer. In some embodiments, the second LED stack comprises a second strain relaxing laminate provided between the second n-type layer and the second active layer. The first and second strain relaxing laminates may be provided in order to accommodate a difference in lattice constants between a lattice constant of the substrate and a lattice constant of the first or second active layer.

In some embodiments, the first multiple quantum well laminate comprises alternating layers of GaN and $In_xGa_{1-x}N$, where $0<X\leq1$. In some embodiments, the second multiple quantum well laminate comprises alternating layers of GaN and $In_yGa_{1-y}N$, where $0<Y\leq1$. In some embodiments, the first and second strain relaxing laminates each comprise alternative layers of GaN and $In_zGa_{1-z}N$, where $0<Z\leq1$. That is to say, in some embodiments, only a first or second strain relaxing laminate may be provided. In some embodiments, both a first and second strain relaxing laminate may be provided wherein the first and second strain relaxing laminates may be the same, or they may be different.

In some embodiments, the first LED stack comprises a first electron blocking layer between the first active layer and the first p-type layer. In some embodiments, the second LED stack comprises a second electron blocking layer between the second active layer and the second p-type layer. The first and second electron blocking layers may comprise a Group III-nitride, for example AlGaN. The first and second electron blocking layers may be configured to increase charge carrier confinement in the respective first or second active region.

In some embodiments, the n++ layer may comprise an etch-stop sublayer. The etch-stop sublayer comprises a Group III-nitride including Al. As such, the etch stop sublayer may be configured to provide a sublayer of the n++ layer which is more resistant to etching than the other material of the n++ layer 40. As such, the etch-stop layer may provide a surface on which a selective removal process may be terminated.

In some embodiments, the first wavelength may be at least 380 nm and no greater than 480 nm. In some embodiments, the second wavelength may be at least 500 nm and no greater than 580 nm. As such, the LED array may provide native LEDs configured to output substantially blue visible light and substantially green visible light.

In some embodiments, each portion of the LED array has surface dimensions on the substrate of less than 100 μm×100 μm. As such, the method according to the first aspect may provide a micro LED array. The micro LED array is an array of micro LEDs.

In some embodiments, the n++ layer has a charge carrier density of at least $10^{19}$ cm$^{-3}$. In some embodiments, the p++ layer has a charge carrier density of at least $10^{19}$ cm$^{-3}$. For example, in some embodiments, the n++ layer may comprise electron donors having an electron donor density ($N_D$) of at least $10^{19}$ cm$^{-3}$. In some embodiments, the p++ layer may comprise electron acceptors having an electron acceptor density ($N_A$) of at least $10^{20}$ cm$^{-3}$.

In some embodiments, the method may further comprise forming a first contact layer on the second n-type layer covering the first LED stack, and/or forming a second contact layer on the second p-type layer of the second LED stack. For example, in some embodiments, the first contact layer comprises one or more metal layers suitable for forming an ohmic contact to an n-type semiconductor (e.g. n-type GaN). As such, the first contact layer may comprise Ti, Al, or Mo (e.g. a Ti or Mo-based stack). In some embodiments, the second contact layer comprises one or more metal layers suitable for forming an ohmic contact to a p-type semiconductor (e.g. p-type GaN). As such, the second contact layer may comprise Ni, Pd, or Pt (e.g. a Ni-based or a Pt-based or a Pd-based stack).

In some embodiments of the first aspect, the steps of selectively removing portions of at least one of the first or second LED stacks comprises selectively depositing a mask layer on portions of the first or second LED stack covering a first or second portion of the substrate surface, and etching an exposed portion of the first or second LED stack to expose the layer(s) below. Advantageously the etching steps according to the first aspect are not terminated on a p-type semiconducting layer.

According to some embodiments of this disclosure, the method comprises performing a step of selectively removing portions of the first LED stack prior to the formation of the second LED stack.

As such, in some embodiments a second portion of the first LED stack may be selectively removed to expose a second portion of the substrate surface before forming the n++ layer, wherein the n++ layer is formed over the substrate surface such that n++ layer covers the first portion of the first LED stack and the second portion of the substrate surface such that the second portion of the second LED stack is provided on the second portion of the substrate surface.

In some embodiments, a second portion of the p++ layer is selectively removed along with the second portion of the first LED stack to expose a second portion of the substrate surface. That is to say, the second portion of the first LED stack and the second portion of the p++ layer are selectively removed prior to the formation of the n++ layer (i.e. between the formation of the p++ layer and the formation of the n++ layer).

That is to say, according to some embodiments of the first aspect, the method comprises:
(a) forming a first LED stack on a substrate surface of a substrate, the first LED stack comprising a plurality of Group III-nitride layers defining a semiconductor junction configured to output light having a first wavelength, wherein a n-type side of the semiconductor junction is orientated towards to the substrate surface;
(b) forming a p++ layer on the first LED stack, the p++ layer comprising a Group III-nitride;
(c) selectively removing a portion of the first LED stack and the p++ layer to define a first portion of the LED array in which the a first portion of the first LED stack and a first portion of the p++ layer is provided and a second portion of the LED array in which the first LED stack and the p++ layer is selectively removed;
(d) forming a n++ layer over the first and second portions of the LED array to cover the p++ layer, wherein a tunnel junction is formed at an interface between the n++ and p++ layer, the n++ layer comprising a Group III-nitride;
(e) forming a second LED stack on the n++ layer; the second LED stack comprising a plurality of Group III-nitride layers defining a semiconductor junction configured to output light having a second wavelength different to the first wavelength, wherein a n-type side of the semiconductor junction is provided closest to the n++ layer; and
(f) selectively removing portions of the second LED stack from the first portion of the LED array in order to define:
a first portion of the LED array in which the second LED stack is selectively removed comprising:
  a first portion of the first LED stack;
  a first portion of the p++ layer; and
  a first portion of the n++ layer such that a tunnel junction is provided on the first portion of the first LED stack; and
a second portion of the LED array comprising:
  a second portion of the n++ layer; and
  a first portion of the second LED structure provided on the second portion of the n++ layer.

In some embodiments, the method may further comprise selectively removing portions of the first and second LED stack in regions of the LED array between the first and second portions of the LED array. For example, the method may comprise:
(f) selectively removing a portion of the first and second LED stacks to expose sidewall surfaces of the first and second LED stacks in order to defined a trench between the first portion of the LED array and the second portion of the LED array; and
(g) depositing a passivation layer in the trench to cover the sidewall surfaces of the first and second LED stacks.

As such, embodiments of the disclosure may provide a method for forming a LED array having different native LEDs.

In some embodiments, a plurality of first LED stacks are formed on the substrate surface on respective first portions of the substrate (i.e. a plurality of first portions of the LED array in which the second LED stack is selectively removed). In some embodiments, a plurality of trenches are formed between the first LED stacks the second LED stack covering a plurality of second portions of the substrate surface. That is to say, in some embodiments, the method according to the first aspect may provide a LED array comprising a plurality of LEDs configured to output light having the first wavelength, and a plurality of LEDs configured to output light having the second wavelength.

In some embodiments, the first LED stack is formed by a process at a first temperature, and the second LED stack is formed by a process at a second temperature lower than the first temperature. Accordingly, the method according to the first aspect may take into account differences in processing temperature for forming the first and second LED stacks. As such, the first LED stack once formed is subjected to the lower processing temperature for forming the second LED stack, thereby reducing or eliminating any heat induced effects associated with the processing temperature. For example, the step of forming the first LED stack may include one or more steps of forming a quantum well layer (forming part of the active layer). As such, the first temperature for forming the first LED stack may be a first temperature used to form the active layer (or a quantum well layer of the active layer). The second temperature for forming the second LED stack may be a second temperature for forming the second active layer, or a quantum well layer of the second active layer. The second temperature will be a lower temperature than the first temperature.

In some embodiments, the second wavelength is longer than the first wavelength. That is to say, the methods according to this disclosure may form the shorter wavelength LEDs first and longer wavelength LEDs subsequently. Shorter wavelength LEDs may have higher processing temperatures than longer wavelength LEDs (i.e. the processing temperature for the first LED stack may be higher than the processing temperature for the second LED stack).

According to some embodiments of this disclosure, the method comprises forming the first LED stack and the second LED stack prior to performing any selective removal step. Importantly, the first and second LED stacks may be formed as continuous layers on a substrate prior to any patterning (selective removal) step. As such, the formation of the first and second LED stacks may be independent of the geometry of the LED array.

Thus, in some embodiments of the first aspect, the second portion of the LED array further comprises a second portion of the p++ layer on which the second portion of the n++ layer is provided, and a second portion of the first LED stack on which the second portion of the p++ layer is provided.

As such, the step of selectively removing some of the first LED stack and some of the second LED stack comprises: a first selective removal step comprising:
  selectively masking the second portion of the second LED stack; and
  selectively removing unmasked portions of the second LED stack, wherein the selective removal step is terminate on the n++ layer; and a second selective removal step comprising:
  selectively masking the first and second portions of the LED array; and
  selectively removing unmasked portions of the LED array.

For example, a method according to the first aspect may comprise:
  (a) forming a first LED stack on a substrate surface of a substrate, the first LED stack comprising a plurality of Group III-nitride layers defining a semiconductor junction configured to output light having a first wavelength, wherein a n-type side of the semiconductor junction is orientated towards to the substrate surface;
  (b) forming a p++ layer on the first LED stack, the p++ layer comprising a Group III-nitride;
  (c) forming a n++ layer over the substrate to cover the p++ layer, wherein a tunnel junction is formed at an interface between the n++ and p++ layer, the n++ layer comprising a Group III-nitride;
  (d) forming a second LED stack on the n++ layer; the second LED stack comprising a plurality of Group III-nitride layers defining a semiconductor junction configured to output light having a second wavelength different to the first wavelength, wherein a n-type side of the semiconductor junction is provided closest to the n++ layer,
  (e) selectively removing a portion of the first LED stack and a portion of the second LED stack on the substrate surface in order to define:
  a first portion of the LED array in which the second LED stack is selectively removed comprising:
    a first portion of the first LED stack;
    a first portion of the p++ layer; and
    a first portion of the n++ layer such that a tunnel junction is provided on the first portion of the first LED stack; and
  a second portion of the LED array comprising:
    a second portion of the first LED stack;
    a second portion of the p++ layer
    a second portion of the n++ layer; and
    a first portion of the second LED structure provided on the second portion of the n++ layer.

In some embodiments, the first and second portions of the LED array may be isolated from each other by selectively removing portions of the second LED stack, the p++ layer, the n++ layer and the first LED stack which encircle the first and second portions of the LED array.

According to a second aspect of the disclosure, a Light Emitting Diode (LED) array precursor is provided. The LED array precursor comprises a substrate, a first LED stack, a p++ layer, a n++ layer and a second LED stack. The substrate has a substrate surface.

The first LED stack is provided on a first portion of the substrate surface, the first LED stack comprising a plurality of first Group III-nitride layers defining a first semiconductor junction configured to output light having a first wavelength wherein a n-type side of the first semiconductor junction is orientated towards the substrate surface. The p++ layer is provided on the first LED stack, the p++ layer comprising a Group III-nitride. The n++ layer has a first portion covering the p++ layer of the first LED stack (e.g. a first portion of the p++ layer of the first LED stack) and a second portion covering a second portion of the substrate surface, wherein a tunnel junction is formed at an interface between the n++ layer and the p++ layer, the n++ layer comprising a Group III-nitride. The second LED stack is provided on the second portion of the n++ layer covering the second portion of the substrate surface, the second LED stack comprising a plurality of second Group III-nitride layers defining a second semiconductor junction configured to output light having a second wavelength different to the first wavelength, wherein a n-type side of the semiconductor junction is provided towards the n++ layer.

In some embodiments, the second portion of the n++ layer is provided on a second portion of the p++ layer, and the second portion of the p++ layer is provided on a second portion of the first LED stack, the first LED stack provided on the substrate surface.

It will be appreciated that the LED array precursor of the second aspect may be provided by the method according to the first aspect of the disclosure. Accordingly, the optional features set out for the first aspect may also be applied to the LED array precursor of the second aspect.

By the term "precursor" in LED array precursor, it is noted that the LED array precursor described does not necessarily include the electrical contacts for each LED such as to allow the emission of light, nor the associated circuitry. Of course, the LED array precursor and method of forming thereof of the first and second aspect does not preclude the addition of further electrical contacts and associated circuitry. As such use of the term precursor in this disclosure is intended to include the finalised product (i.e. a LED array etc.).

BRIEF DESCRIPTION OF THE FIGURES

The disclosure will now be described in relation to the following non-limiting figures. Further advantages of the disclosure are apparent by reference to the detailed description when considered in conjunction with the figures in which:

FIG. 2 shows a diagram of an intermediate step of a method according to a first embodiment of the disclosure;

FIG. 3 shows a diagram of an intermediate step of a method according to a first embodiment of the disclosure in a tunnel junction and a second LED stack is formed over the intermediate structure of FIG. 2;

FIG. 4 shows a diagram of a LED array precursor according to an embodiment of the disclosure;

DETAILED DESCRIPTION

According to a first embodiment of the disclosure a method for forming a LED array precursor is provided. The method of the first embodiment is described below with reference to FIGS. 2-4.

Figure 1A:
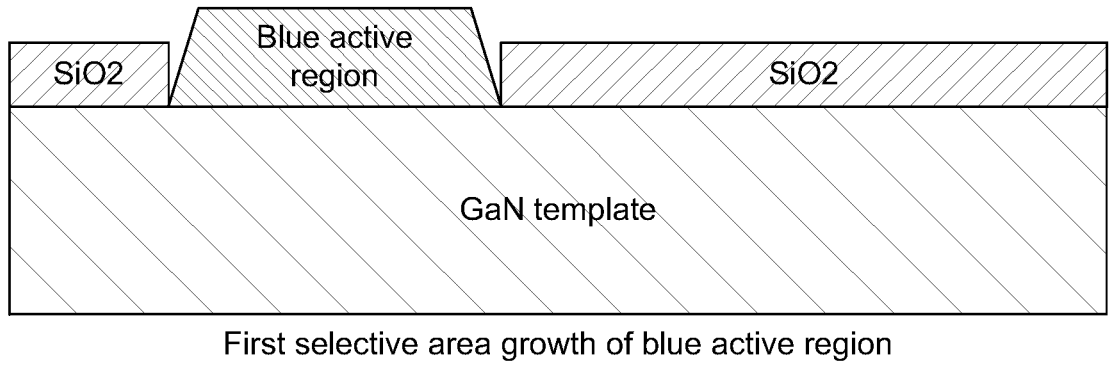
FIGS. 1a and 1b show diagrams of a method of forming a LED array precursor by SAG known in the prior art.
Figure 1B:
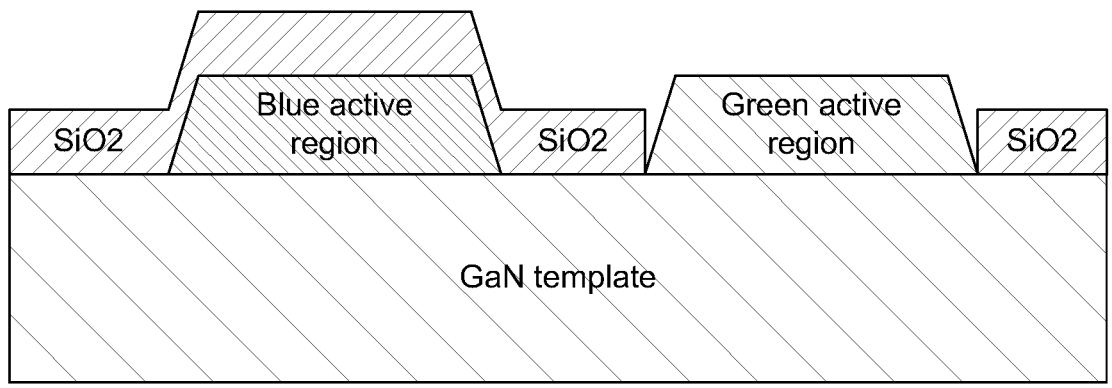

As shown in FIG. 2, a substrate 10 is provided. The substrate 10 comprises a Group III-nitride. For example, in the embodiment of FIG. 1, the substrate 10 comprises a GaN layer. The substrate 10 may be an n-type doped Group III-nitride. In the embodiment of FIG. 1, the substrate 10 comprises n-type doped GaN. The n-type dopant may be any suitable n-type dopant for Group III-nitrides, for example Si or Ge. The substrate 10 may be n-type doped with a donor density of about $10^{17}$-$10^{19}$ cm$^{-3}$.

In some embodiments, the substrate 10 may be a single layer of GaN. In other embodiments, the substrate 10 may comprise a layer of comprising a Group-III nitride provided on a supporting wafer. For example, in some embodiments, the substrate 10 may comprise one or more Group III-nitride layers provided on a Si, SiC, or Sapphire wafer.

Next, a first LED stack 20 is formed on a surface of the substrate 10. The first LED stack 20 may be formed across a substantial portion of the substrate surface 11 (e.g. the entire surface). The first LED stack 20 comprises a plurality of layers. Each of the layers of the first LED stack 20 may be formed as a substantially continuous layer. As such, the first LED stack 20 may be formed as a substantially continuous stack on the substrate surface 11.

The first LED stack 20 comprises a plurality of Group III-nitride layers such that the first LED stack forms a semiconductor junction configured to output light having a first wavelength. As is known in the art, the semiconductor junction may be a diode having a p-type side and an n-type side. Accordingly, the plurality of layers of the first LED stack are arranged on top of each other to define the semiconductor junction.

In the embodiment of FIG. 2, the first LED stack 20 comprises a first active layer 21, and a first p-type semiconducting layer 22.

In some embodiments, the first LED stack may also comprise one or more of: a first n-type semiconducting layer 23, and a first electron blocking layer 24.

As shown in FIG. 2, the first active layer 21 may be formed on the substrate surface 11. The first active layer 21 is configured to generate light of a first wavelength as part of the first LED stack.

In the embodiment of FIG. 2, the first active layer 21 may comprise one or more quantum well layers (not shown). As such, the first active layer 21 may be a multiple quantum well layer. The quantum well layers within the first active layer 21 may comprise a Group III-nitride semiconductor, preferably a Group III-nitride alloy including In. For example, in the embodiment of FIG. 1 the first active layer 21 may comprise alternating layers of GaN and $In_XGa_{1-X}N$, where $0<X\leq1$. In particular, in some embodiments, the first active layer 21 may comprise $In_XGa_{1-X}N$ layers where $0<X\leq0.2$. As such, the first active layer 21 of the LED in some embodiments may be configured to output light having a wavelength of at least 380 nm, and no greater than 490 nm.

The thickness and In content (X) of the quantum well layer may be controlled in order to control the wavelength of light generated by the first active layer 21. The first active layer 21 may be formed as a continuous layer covering a substantial portion (e.g. all) of the substrate surface 11. The first active layer 21 may be deposited using any suitable process for the fabrication of Group III-nitride thin films, for example, Metal Organic Chemical Vapour Deposition (MOCVD), or Molecular Beam Epitaxy (MBE).

In some embodiments, the first LED stack 20 may comprise a first strain relaxed layer 25 provided between the first active layer 21 and the substrate 10. Strain relaxed layers are discussed in more detail below with reference to FIGS. 15 and 16.

In some embodiments, a first n-type semiconducting layer 23 may be deposited on the substrate surface 11, prior to the formation of the first active layer 21. The first n-type semiconducting layer 23 may comprise a Group III-nitride. The first n-type semiconducting layer 23 may be doped with a suitable electron donor, for example Si, or Ge. The first n-type semiconducting layer 23 may be formed as a continuous layer covering a substantial portion (e.g. all) of the substrate surface 11. The first n-type semiconducting layer 23 may improve the charge carrier injection into the first active layer 21 of the first LED.

Further layers of the first LED stack 20 may then be deposited on the first active layer 21 on an opposite side of the first active layer 21 to the substrate surface 11.

In some embodiments, a first electron blocking layer 24 is provided on the active layer 21. The first electron blocking layer 24 is provided on a side of the first active layer 21 opposite to a side of the first active layer 21 on which the substrate 10 is provided. The first electron blocking layer 24 comprises a Group III-nitride. The first electron blocking layer 24 may be formed as a continuous layer covering a substantial portion (e.g. all) of the exposed surface of the active layer 21. The first electron blocking layer 24 is configured to reduce electron flow from the first active layer 21 into the first p-type semiconducting layer 22 of first LED stack. For example, in some embodiments, the first electron blocking layer 24 may comprise $Al_xGa_{1-x}N$. Further details of suitable electron blocking layers may be found in at least APPLIED PHYSICS LETTERS 103, 061104 (2013).

As shown in FIG. 2, a p first-type semiconducting layer 22 is provided over the first active layer 21. The first p-type semiconducting layer 21 is provided on a side of the first active layer 21 opposite the side of the first active layer 21 on which the substrate 10 is provided. The first p-type semiconducting layer 22 comprises a Group III-nitride. The first p-type semiconducting layer 22 is doped with a suitable electron acceptor, for example Mg. The first p-type semiconducting layer 22 may have an acceptor density ($N_A$) of about $10^{19}$ — $10^{21}$ cm$^{-3}$. The first p-type semiconducting layer 22 may be formed as a continuous layer covering a substantial portion (e.g. all) of the exposed surface of the first active layer 22 (or first electron blocking layer 24 if present).

In some embodiments, each of the layers of the first LED stack 20 may be deposited using any suitable process for the fabrication of Group III-nitride thin films, for example, Metal Organic Chemical Vapour Deposition (MOCVD), or Molecular Beam Epitaxy (MBE).

The formation of the first LED stack 20 on the substrate 10 provides a first portion of the LED array (A) in which a first LED is to be formed. The first LED may output light having a first wavelength.

Following the formation of the first LED stack 20, a p++ layer 30 is formed on the first LED stack 20. The p++ layer 30 comprises a Group III-nitride. The p++ layer 30 is Group III-nitride layer which in some embodiments may be a substantially degenerate p-type semiconductor. For example, the p++ layer 30 may be doped with any suitable acceptor having an acceptor density $N_A$ of at least $10^{20}$ cm$^{-3}$. For example, in the embodiment of FIG. 2, the p++ layer comprises GaN which is doped with Mg having an acceptor density of about $3\times10^{20}$ cm$^{-3}$. Thus, the p++ layer 30 may have a charge carrier density of at least $10^{19}$ cm$^{-3}$. The p++ layer 30 is provided to form one part of a tunnel junction. By forming a tunnel junction over the first LED stack, Mg doped layers (i.e. p-type semiconducting layer 22 and p++ layer 30) may not be substantially exposed to an etchant which in turn may affect the conductivity of the Mg doped layers.

As shown in FIG. 2, following the formation of the p++ layer 30, a portion of the p++ layer and the first LED stack 20 is selectively removed.

For example, in FIG. 2 the selective removal step is provided by an etching process. In the etching process, a first mask layer (not shown) may be deposited on the exposed surface of the p++ layer 30. The first mask layer is configured to mask a portion of the first LED stack 20 and p++ layer which is intended to form a first portion of the LED array precursor (A). The first mask layer may define one or more apertures which are intended to define at least a second portion of the LED array (B). Portions of the first LED stack 20 and p++ layer 30 which are exposed by the apertures of the mask layer may then be selectively removed using an etchant. As shown in FIG. 2, the etchant may etch away portion of the p++ layer 30 and the first LED stack 20 to the substrate 10. As shown in FIG. 1, the etchant may etch partially into the thickness of the substrate 10 to ensure that the layers of the first LED stack 20 are removed. The first mask layer may then be removed from the p++ layer 30.

The mask layer may be provided using any known method in the art. For example, the mask layer may be provided using a lithography method.

As shown in FIG. 2, the selective removal step may expose the substrate 10 at a second portion of the LED array B. The exposed surface of the substrate 10 in the second portion B of the LED array may be substantially parallel to the surface of the substrate 11, and each of the layers of the first LED stack 20.

The selective removal step is provided in order to form a second portion of the LED array B in which a second LED B1 is to be provided. The second LED B1 is formed from a second LED stack 50. The second LED B1 may have output light having a different (second) wavelength to the first LED stack 20.

Although in FIG. 2, only one portion of the first LED stack 20 and p++ layer 30 is shown to be removed, it will be appreciated that in other embodiments, a plurality of portions may be selectively removed. As such, the LED array precursor may comprise a plurality of second portions B in which second LEDs are to be provided.

Following the selective removal step, a plurality of layers are formed over the first and second portions of the LED array A, B. FIG. 3 shows an example of an intermediate structure formed after the formation of said plurality of layers over the structure of FIG. 2.

Thus, as shown in FIG. 3, an n++ layer 40, and a second LED stack 50 are formed over the intermediate structure of FIG. 2.

The n++ layer 40 is formed first on a surface of the p++ layer 30. The n++ layer 40 comprises a Group III-nitride. For example, the n++ layer may be doped with any suitable electron donor having a donor density $N_D$ of at least $10^{19}$ cm$^{-3}$. For example, in the embodiment of FIG. 3, the n++ 40 layer comprises GaN which is doped with Si having a donor density of about $3\times10^{19}$ cm$^{-3}$. Accordingly, the n++ layer 40 may have a charge carrier density of at least $10^{19}$ cm$^{-3}$. The n++ layer 40 is provided to form a tunnel junction in combination with the p++ layer 30 on which it is provided. By forming a tunnel junction over the first LED stack, Mg doped layers (i.e. p-type semiconducting layer 22 and p++ layer 30) are protected from any subsequent etching steps. By forming a tunnel junction, it is still possible to make electrical contact to the active layer 21 of the first LED stack 20 through the tunnel junction. Accordingly, the provision of the tunnel junction on the first LED stack 20 enables further LED stacks (i.e. second LED stack 50) to be formed and patterned on the substrate 10 without compromising the electrical properties of the first LED stack 20.

As shown in FIG. 3, the tunnel junction is formed over the first portion of the LED array A. The tunnel junction is not formed on the second portion of the LED array B, as no p++ layer 30 is present due to the previous selective removal step.

As shown in FIG. 3, the n++ layer 40 is formed a substantially continuous layer across the substrate surface 11. At a transition portion C between the first and second portions of the LED array A, B the n++ layer 40 may be inclined with respect to the surface. These transition portions C of the LED array may be removed in subsequent processing steps.

In some embodiments, the n++ layer 40 may comprise an etch-stop sublayer (not shown). The etch-stop sublayer comprises a Group III-nitride. The etch stop sublayer is configured to provide a sublayer of the n++ layer 40 which is more resistant to etching than the other material of the n++ layer 40. As such, the etch-stop layer may provide a surface on which a selective removal process may be terminated. In some embodiments, the etch stop sublayer may comprise $Al_ZGa_{1-Z}N$, where $0<Z\leq1$. Further details of suitable etch-stop sublayers may be found in at least Jpn. J. Appl. Phys. Vol. 42 (2003) pp. L 1139-L 1141.

For example, in some embodiments, the n++ layer 40 may comprise an etch stop sublayer provided between n++ sublayers. The n++ sublayers may have substantially the same composition as the n++ layer 40 described above.

In some embodiments, the p++ layer may be subjected to one or more surface treatment processes prior to the formation of the n++ layer. For example, the p++ layer may be subjected to an annealing step prior to the formation of the n++ layer. The annealing step may be provided to increase the activation of the acceptor ions in the p++ layer (e.g. Mg ions). The p++ layer may be subjected to a surface treatment process in which the p++ layer is exposed to BHF. The BHF treatment may counteract a concentration of acceptor ions formed near the surface of the p++ layer on which the n++ layer is to be formed. By applying one or more surface treatment processes to the p++ layer, a resistance of the tunnel junction formed between the n++ layer and the p++ layer may be reduced. As such, the deposition of the p++ layer and the n++ layer may take place in two different depositions steps separated by an ex-situ surface treatment step. Such a method may reduce or prevent the diffusion of acceptor ions (e.g. Mg) from the p++ layer to the n++ layer.

Further details of suitable surface treatment processes may be found in at least SeungGeun Lee et al 2018 Appl. Phys. Express 11 062703.

Following the formation of the n++ layer 40, the second LED stack 50 may be provided on the n++ layer 40. In FIG. 3, the second LED stack 50 is provided on a side of the n++ layer 40 which is opposite a side of the n++ layer 40 on which the p++ layer 30 is provided. The second LED stack 50 may be formed across a substantial portion of the n++ layer 40 (e.g. the entirety of the n++ layer 40). The second LED stack 50 comprises a plurality of layers. Each of the layers of the second LED stack 50 may be formed as a substantially continuous layer. As such, the second LED stack 50 may be formed as a substantially continuous stack.

The second LED stack 50 comprises a plurality of Group III-nitride layers such that the second LED stack 50 forms a semiconductor junction configured to output light having a second wavelength. As is known in the art, the semiconductor junction may be a diode having a p-type side and an n-type side. Accordingly, the plurality of layers of the second LED stack 50 are arranged on top of each other to define the semiconductor junction. The n-type side of the second LED stack 50 is provided towards the substrate 10, with the p-type side of the second LED stack 50 on the opposite side. As such, the second LED stack defines a semiconductor junction with the same orientation as the semiconductor junction of the first LED stack 20.

In the embodiment of FIG. 3, the second LED stack 50 comprises a second active layer 51, and a second p-type semiconducting layer 52.

In some embodiments, the second LED stack 50 may also comprise, one or more of a second n-type semiconducting layer 53, and a second electron blocking layer 54. As such, the second LED stack may have a similar structure to the first LED stack 10.

As shown in FIG. 3, the second active layer 51 may be formed on the exposed surface of the n++ layer 40. The second active layer 51 is configured to generate light of a second wavelength as part of the second LED stack.

In the embodiment of FIG. 3, the second active layer 51 may comprise one or more quantum well layers (not shown). As such, the second active layer 51 may be a multiple quantum well layer. The quantum well layers within the second active layer 51 may comprise a Group III-nitride semiconductor, preferably a Group III-nitride alloy including In. As such, the second active layer 51 may have a similar general structure to the first active layer 21 of the first LED stack 20. For example, in the embodiment of FIG. 3 the second active layer 21 may comprise alternating layers of GaN and $In_{X2}Ga_{1-X2}N$, where $0<X2\leq1$. In particular, in some embodiments the second active layer may be provided such that the second wavelength is longer than the first wavelength. Thus, in some embodiments, the second active layer may comprise $In_{X2}Ga_{1-X2}N$ layers where the In content said layers (X2) is larger than the In content (X1) of the respective layers of the first active layer 21. For example, in some embodiments, the second active layer may comprise $In_{X2}Ga_{1-X2}N$ layers where $0<X2\leq0.5$, or $0.2\leq X2<1.5$.

As such, the second active layer 51 of the may be configured to output light having a wavelength of at least 490 nm. In some embodiments, the second active layer 51 may be configured to output substantially green light having wavelengths in the range 510 nm to 580 nm. The thickness and In content (X2) of the quantum well layers may be controlled in order to control the wavelength of light generated by the second active layer 51. The second active layer 51 may be formed as a continuous layer covering a substantial portion (e.g. all) n++ layer 40. The second active layer 51 may be deposited using any suitable process for the fabrication of Group III-nitride thin films, for example, Metal Organic Chemical Vapour Deposition (MOCVD), or Molecular Beam Epitaxy (MBE).

In some embodiments, the second LED stack 50 may comprise a second strain relaxed layer 55. Further discussion of the first and second strain relaxed layers 25, 55 is provided below with reference to FIGS. 15 and 16.

In some embodiments, a second n-type semiconducting layer 53 may be deposited on the n++ layer 40, prior to the formation of the second active layer 51. The second n-type semiconducting layer 53 may comprise a Group III-nitride. The second n-type semiconducting layer 53 may be doped with a suitable electron donor, for example Si, or Ge. The second n-type semiconducting layer 53 may be formed as a continuous layer covering a substantial portion (e.g. all) of the n+ layer 40. The second n-type semiconducting layer 53 may improve the charge carrier injection into the second active layer 51 of the LED precursor.

Further layers of the second LED stack 50 may then be deposited on the second active layer 51 on an opposite side of the active layer 51 to the n++ layer 40.

Similar to the first LED stack, in some embodiments, a second electron blocking layer 54 may be provided on the second active layer 51. The electron blocking layer 54 may be provided on a side of the second active layer 51 opposite to a side of the second active layer 51 on which the n++ layer 40 is provided. The second electron blocking layer 54 may be provided in a similar manner to the first electron blocking layer 24.

As shown in FIG. 3, a second p-type semiconducting layer 52 is provided over the second active layer 51. The second p-type semiconducting layer 51 is provided on a side of the second active layer 51 opposite the side of the active layer 51 on which the n++ layer 40 is provided. The second p-type semiconducting layer 52 may be provided in a similar manner to the first p-type semiconducting layer 22 as discussed above.

In some embodiments, each of the layers of the second LED stack 50 may be deposited using any suitable process for the fabrication of Group III-nitride thin films, for example, Metal Organic Chemical Vapour Deposition (MOCVD), or Molecular Beam Epitaxy (MBE).

Following the forming of the second LED stack 50, the second LED stack 50 may be patterned in order to define the first and second portions of the LED array A, B.

In accordance with the first embodiment of the disclosure, a first portion of the second LED stack 50 formed on the first portion of the LED array A may be selectively removed, while a second portion of the second LED stack 50 formed on the second portion of the LED array B is retained (i.e. not selectively removed). The first portion of the second LED stack 50 may be selectively removed by an etching process similar to the process described above for patterning the first LED stack 20. Importantly, the process of selectively removing the second LED stack may be terminated on the n++ layer 40 provided below the second LED stack. Accordingly, selectively removing the second LED stack 50, for example by etching, may be performed without compromising the electrical properties of the first LED stack 20, in particular any Mg-doped (i.e. p-type) layers in the first LED stack 20.

FIG. 4 shows an example of an LED array precursor formed by the above method. As shown in FIG. 4, the LED array precursor comprises a first portion of the LED array A in which the second LED stack 50 is selectively removed. The first portion of the LED array A comprises a first portion of the first LED stack 20a, a first portion of the p++ layer 30a, and a first portion of the n++ layer 40a such that a tunnel junction is provided on the first portion of the first LED stack. The LED array precursor also comprises a second portion B which comprises a second portion of the n++ layer 40b, and a first portion of the second LED stack 50b provided on the second portion of the n++ layer 40b.

Accordingly, the method of forming an LED array precursor may provide an array with distinct regions for forming LEDs having different wavelengths. As such, the LED array precursor formed by the method of the first embodiment has a first portion in which one or more LEDs of a first wavelength (e.g. blue light) may be formed. The LED array precursor also has one or more second portions in which LEDs of a second wavelength (e.g. green or red) may be formed.

As shown in FIG. 4, the LED array precursor may be further processed to separate the first and second LED array portions from each other. Accordingly, the method may further comprise forming a trench between the first portion of the LED array and the second portion of the LED array by selectively removing layers of the first and second LED stacks to expose sidewall surfaces of the first and second LED stacks. As such, transition portions C between the first and second portions A, B of the LED array may be removed by a selective removal process, for example an etching process.

The LED array 1 may be subjected to further processing steps in order to provide a LED array. One example of an LED array formed from the LED precursor of FIG. 4 is shown in FIG. 5.

Figure 5:
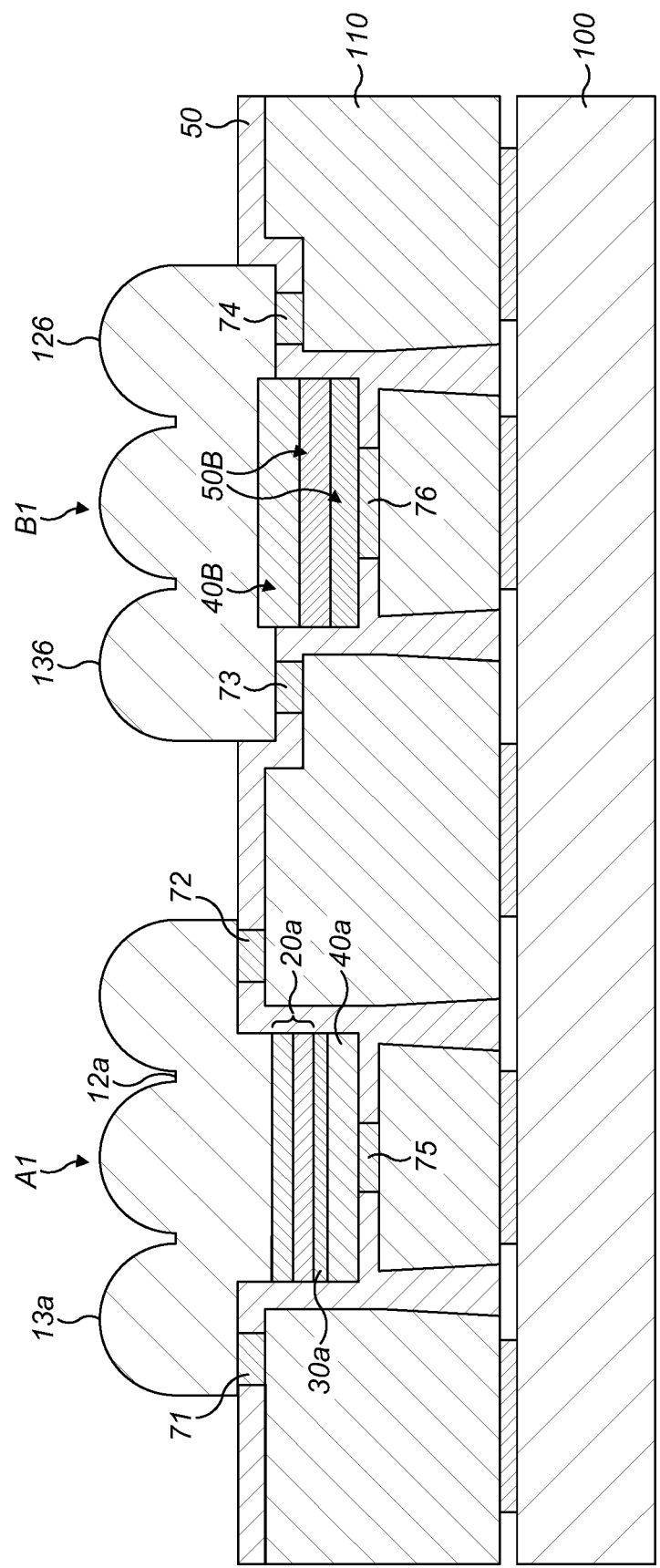
FIG. 5 shows a diagram of a LED array according to an embodiment of the disclosure.

In the embodiment of FIG. 5, the first portion of the LED array precursor A has been processed to provide a first LED A1 and the second portion the LED array precursor has been processed to provide a second LED B1.

The first and second LEDs of FIG. 5 have been formed by depositing a passivation layer 60 over the first and second portions A, B of the LED array. The passivation layer 60 may be an electrical insulator. The passivation layer 60 may, for example comprise $SiO_2$.

Contact vias 71, 72, 73, 74, 75, 76 comprising a metal have been formed through the passivation layer 60 to provide suitable electrical contact to the respective p and n sides of each LED. Each of the first contact vias 71, 72, 73, 74 may be configured to make contact to an n-type side of a semiconductor junction. For example, each of the first contact vias 71, 72, 73, 74 are cathode contacts and may comprise Ti, Al, or a Ti and Al metal stack Ti/Al. Second contact vias 75 is provided to make electrical contact to the p-side of the first LED A1. Due to the presence of the tunnel junction in the first LED A1, the second contact via is in direct electrical contact with n++ layer 40 and is the anode contact for the LED A1. Accordingly, the second contact via 75 may comprise Ti, Al, or a Ti and Al metal stack. In some embodiments, the second contact via 75 may be formed in the same deposition step as the first contact via 71, 72, 73, 74. Third contact via 76 is provided to make electrical contact to the p-side of the second LED B1. As no tunnel junction is present in the second LED B1, the third contact via 76 is in direct electrical contact with the second p-type semiconducting layer 52. Accordingly, the third contact via may comprise a suitable metal to forma an Ohmic contact to p-type GaN such as a Ni/Ag.

As shown in FIG. 5, the LED array precursor of FIG. 4 may subsequently be bonded to backplane electronics substrate 100. The backplane electronics substrate 100 may comprises contact surfaces and control electronics configured to provide power to the first and second LEDs A1 B1. A gap filling contact layer 110 may be deposited over the LED array precursor in order to provide electrical contact between the contact vias 71, 72, 73, 74, 75, 76 and the backplane electronics substrate 100.

As shown in FIG. 5, the substrate 10 may also be subjected to further selective removal steps in order to pattern a light emitting surface 12a, 12b of the substrate 10. The light emitting surface 12a, 12b may be provided on an opposite side of the substrate 10 to the respective active layers 21, 51 of the first and second LEDs A1, B1. The light emitting surface 12a 12b of the substrate may have one or more convex lens structures 13a, 13b formed in it by selective removal. As shown in Fig. g, each of the first and second LEDs A1 B1 has three convex lens structures 13a, 13b formed in it. The convex lens structure may increase the light extraction efficiency of the LED. In other embodiments, the light emitting surface may be shaped to such that a randomness of direction in which photons are emitted from the light emitting surface 12a, 12b is increased. For example, in some embodiments, a surface roughness of the light emitting surface may be increased. Accordingly, a LED array may be provided according to the above method.

Next, a method of forming a LED array precursor 1 will be described according to a second embodiment of the disclosure. The method of the second embodiment is described with reference to FIGS. 6-9.

Figure 6:
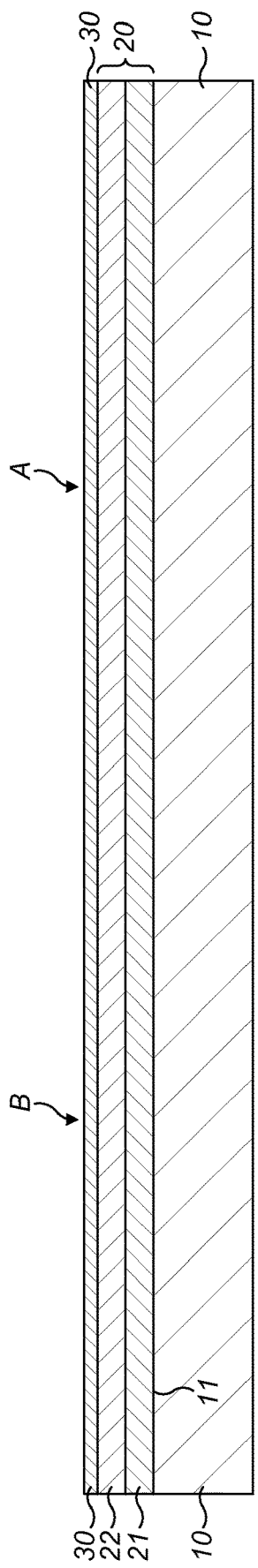
FIG. 6 shows a diagram of an intermediate step of a method according to an second embodiment of the disclosure.

As shown in FIG. 6, a first LED stack 20 is formed on a substrate surface of a substrate 10. The substrate 10 and first LED stack 20 may be formed substantially as described above according to the method of the first embodiment.

Next, a p++ layer 30 is formed on the first LED stack. The p++ layer is formed on a side of the first LED stack 20 which is opposite to a side of the first LED stack 20 on which the substrate 10 is provided. The p++ layer 30 may be formed substantially as described above according to the method of the first embodiment. Accordingly, the method according to the second embodiment may form an intermediate structure as shown in FIG. 6. In FIG. 6, each of the substrate 10, first LED stack 20 and p++ layer 30 are provide as continuous layers which are formed monolithically with each other.

Figure 7:
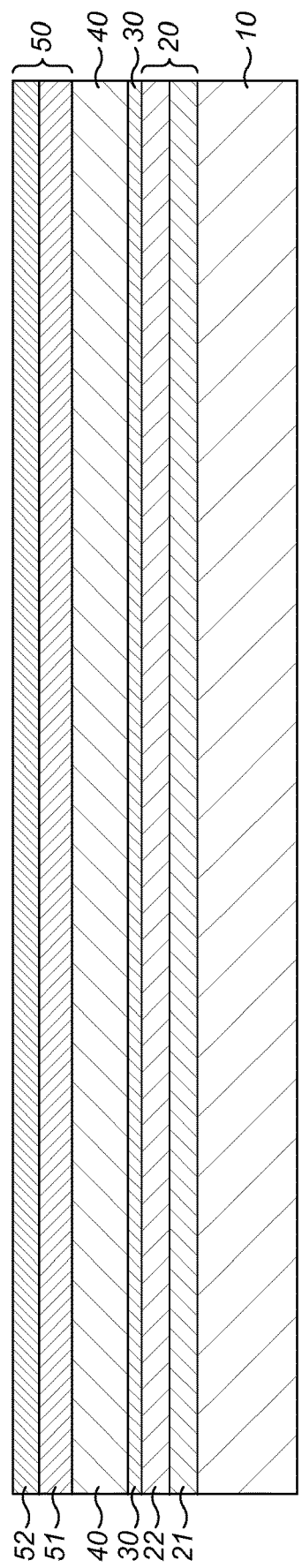
FIG. 7 shows a diagram of an intermediate step of a method according to the second embodiments in which a first LED stack, tunnel junction, and second LED stack are formed on a substrate.

Next, as shown in FIG. 7, an n++ layer 40 is formed on the p++ layer 30. The n++ layer 40 is formed on the p++ layer 30 such that a tunnel junction is formed at the interface between the two layers. The n++ layer 40 may be similar to the n++ layer 40 of the first embodiment. By contrast to the method of the first embodiment, in the method of the second embodiment, the n++ layer 40 is formed on the p++ layer 30 prior to a selective removal step. That is to say, the n++ layer 40 is formed over substantially the entire p++ layer 30, including a first portion of the p++ layer 30a and a second portion of the p++ layer 30b forming respective first and second portions of the LED array A, B.

As shown in FIG. 7, a second LED stack 50 is then formed on the n++ layer 40. The second LED stack 50 may be formed in a similar manner to the second LED stack 50 of the first embodiment. By contrast to the method of the first embodiment, in the method of the second embodiment, the second LED stack 50 is formed on the n++ layer 40 prior to a selective removal step. Thus, the intermediate structure of FIG. 7 may be formed. As shown in FIG. 7, each of the layers forming the intermediate structure are provided as continuous layers which are formed monolithically with each other.

According to the method of the second embodiment, all of the layers of the first and second LED stacks 20, 50 may be formed on a substrate 10 without any intervening patterning steps. As such, the method of the second embodiment allows the layers of the first and second LED stacks 20, 50 to be formed independently of the geometry, or layout, of the LED array. Importantly, the layers of the second LED stack 50 may be formed on a surface which may not have been subjected to a selective removal step (e.g. etching). Such a selective removal step may introduce surface damage into the surface on which the second LED stack is formed, which may in turn affect the electrical and/or mechanical properties of the second LED stack 50. Accordingly, the resulting layers of the second LED stack 50 in the second embodiment may be formed with improved electrical properties, compared to a process in which a selective removal step is performed prior to the formation of the second LED stack 50.

Figure 8:
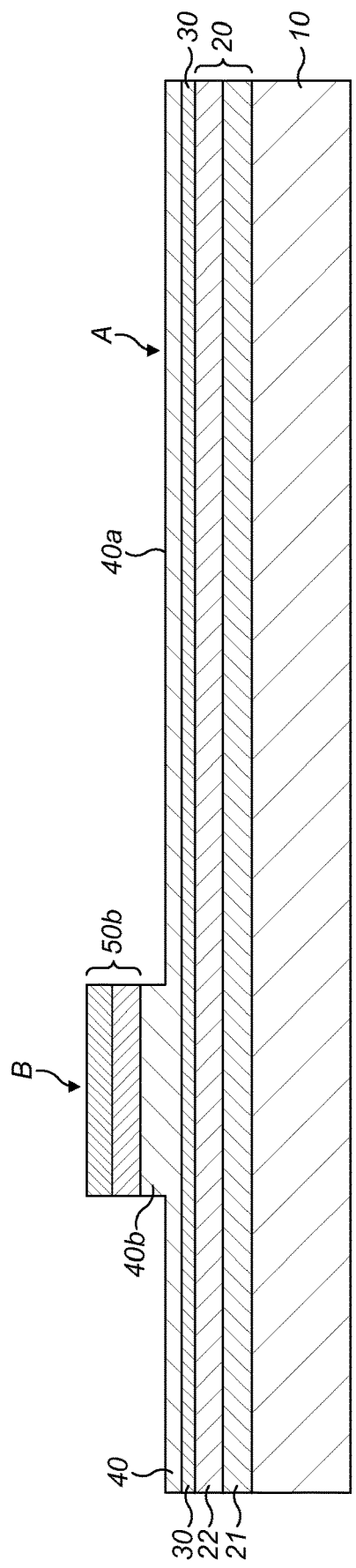
FIG. 8 shows a diagram of an intermediate step of a method according to the second embodiment in which the second LED stack is patterned.

Next, the intermediate structure of FIG. 7 is patterned using a selective removal process. In the second embodiment of the method, the selective removal process initially removes portions of the second LED stack 50, including a first portion of the second LED stack, whilst a second portion of the second LED stack 50b is not selectively removed. The selective removal step may be performed using an etching process as described above. As shown in FIG. 8, the etching process may be terminated on the n++ layer 40 of the tunnel junction. Accordingly, the provision of the tunnel junction allows the etching process to be performed without being terminated on a layer comprising Mg doping (e.g. p++ layer 30), whilst still allowing electrical contact to be made to the first LED stack through the tunnel junction. Terminating the selective removal process on the n++ layer 40 also allows electrical contact to be made to the n-side of the second portion of the second LED stack 50b.

The selective removal step provides a second portion of the LED array B in which a second portion of the second LED stack 50b is provided on the tunnel junction (the n++ layer 40 and the p++ layer 30), the first LED stack 20 and the substrate 10. The second portion of the second LED stack 50b forms a mesa structure with respect to the tunnel junction surface surrounding the second LED stack 50b. That is to say, the second portion of the second LED stack 50b extends from the surface formed by the n++ layer 40.

Figure 9:
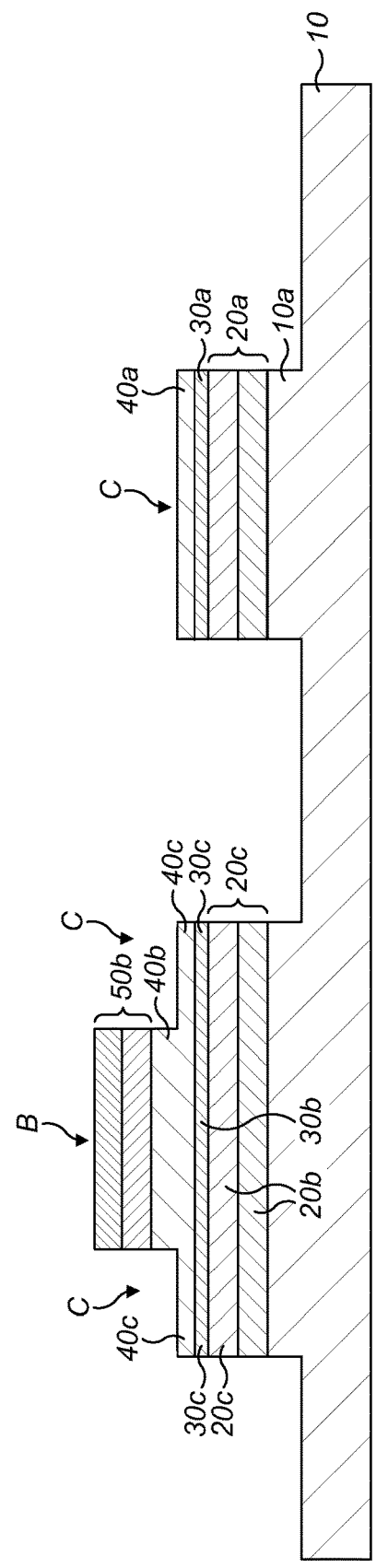
FIG. 9 shows a diagram of a LED array precursor according to an embodiment of the disclosure.

FIG. 9 shows a LED array precursor formed by the method of the second embodiment. Following the formation of the intermediate structure of FIG. 8, the structure undergoes a further selective removal step to define first and second LEDs A, B of the LED array precursor.

As shown in FIG. 9, a further selective removal step is performed in which portions of the first LED stack 20 and tunnel junction (n++ layer 40 and p++ layer 30) are selectively removed. For example, as shown in FIG. 9, portions of the first LED stack 20 and tunnel junction (n++ layer 40 and p++ layer 30) are selectively removed around a first portion of the first LED stack 20 and tunnel junction in order to form a first LED A. Accordingly, the method according to the second embodiment provides a first portion of the LED array A in which the second LED stack is selectively removed comprising a first portion of the first LED stack 20a, a first portion of the p++ layer 30a; and a first portion of the n++ layer 40a such that a tunnel junction is provided on the first portion of the first LED stack 20a.

Portions of the first LED stack 20 and tunnel junction are also selectively removed around the second portion of the second LED stack 50b to form a second LED B. Accordingly, the method of the second embodiment provides a second portion of the LED array B comprising a second portion of the n++ layer 40b and a second portion of the second LED structure 50b provided on the second portion of the n++ layer 40b. As shown in FIG. 9, the second portions of the n++ layer 40b and the second LED stack 50b are provided on a second portion of the p++ layer 30b, and a second portion of the first LED stack 20b on which the second portion of the p++ layer 30b is provided.

As shown in FIG. 9, the selective removal process may retain a contact portion of the tunnel junction 30c, 40c and a contact portion of the first LED stack 20 c adjacent to the second portion of the LED array (the second LED) B. The contact portion of the n++ layer, p++ layer and first LED stack 20c, 30c, 40c may encircle the second portion of the LED array B. The contact portion 20c, 30c, 40c provides a surface of the n++ layer 20c which is in direct electrical contact with the second portion of the n++ layer 40b. Accordingly, the n++ layer 40b, 40c allows electrical contact to be made to the n-side of the semiconductor junction of the second LED stack 50b. The second portion of the second p-type semiconducting layer may be used to make electrical contact to the p-side of the semiconductor junction of the second LED stack 50b.

Figure 10:
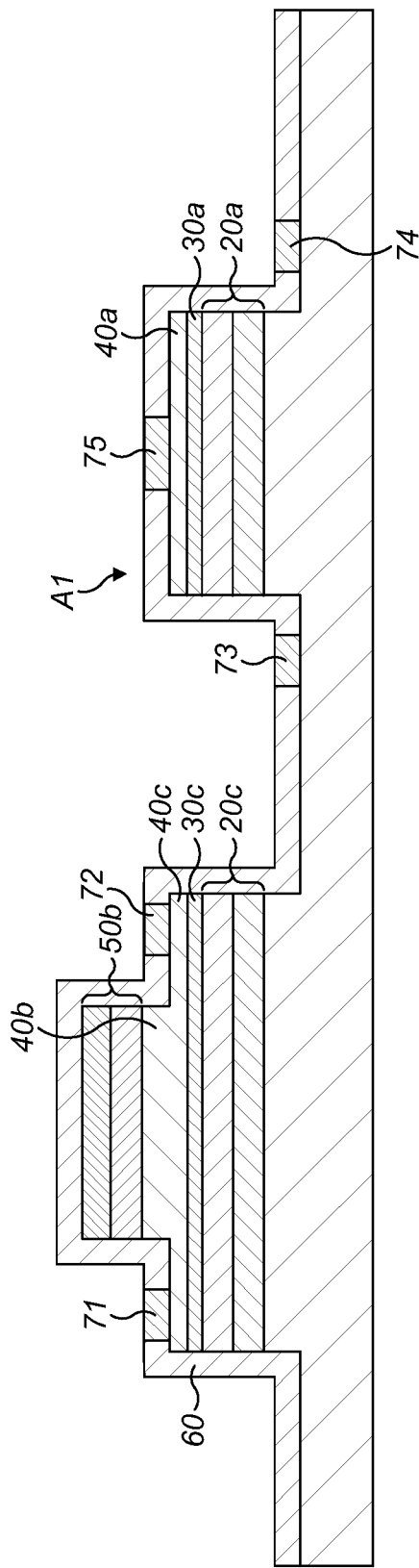
FIG. 10 shows a diagram of a LED array precursor including a passivation layer.
Figure 11:
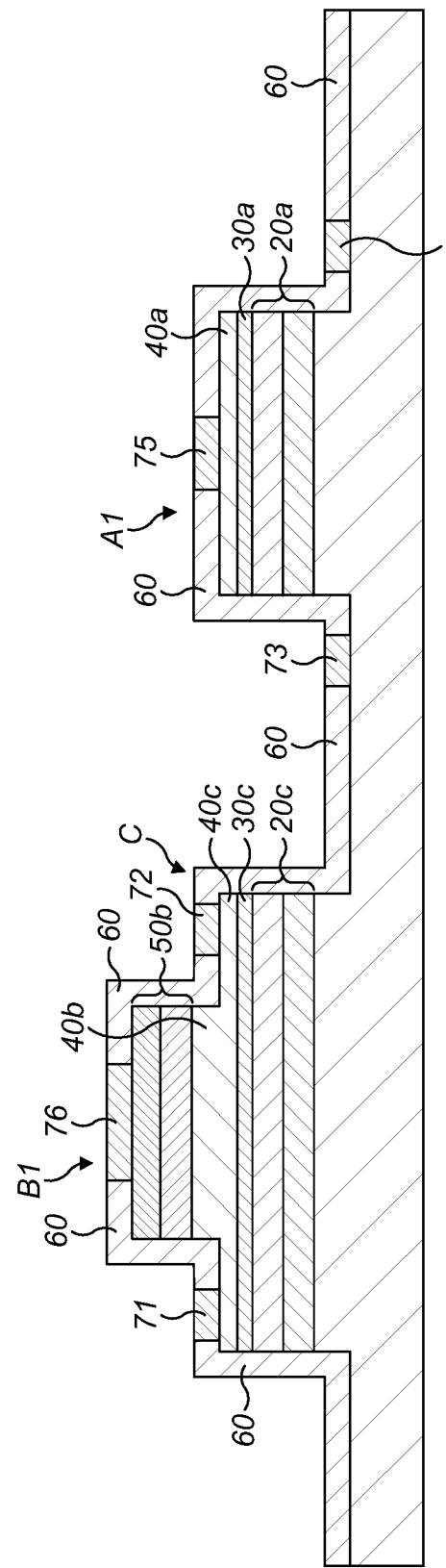
FIG. 11 shows a diagram of a LED array precursor including a passivation layer and a plurality of contact vias.

FIGS. 10 and 11 show further processing steps of the LED array precursor 1 which may be performed in some embodiments of the disclosure in order to form one or more contact vias to the LEDs A, B of the array.

Similar to the LEDs of FIG. 5, the LED array precursor in FIG. 10 is further processed by forming a passivation layer 60 over the first and second portions A, B of the LED array. As shown in FIG. 10, the passivation layer 60 also covers the contact portion C of the LED array. The passivation layer 60 may be an electrical insulator. The passivation layer 60 may, for example comprise $SiO_2$.

Contact vias 71, 72, 73, 74, 75, 76 comprising a metal have been formed through the passivation layer 60 to provide suitable electrical contact to the respective p and n sides of each LED. For example, as shown in FIG. 10, first contact vias 73, 74 are provided to make contact to the n-side of the first LED A1 via the substrate 10. Each of the first contact vias, 73, 74 may be configured to make contact to an n-type side of a semiconductor junction. For example, each of the first contact vias 73, 74 may comprise aluminium (Al), or a bilayer electrical contact comprising a layer of Ti and a layer of Al. Second contact via 75 is provided to make electrical contact to the p-side of the first LED A1. Due to the presence of the tunnel junction in the first LED A1, the second contact via 75 is in direct electrical contact with n++ layer 40. Accordingly, the second contact via may comprise a suitable metal configured to form an Ohmic contact to the n++ layer 40, for example a second contact via 75 comprising layers of Ti and/or Al. Third contact via 76 is provided to make electrical contact to the p-side of the second LED B1. As no tunnel junction is present in the second LED B1, the third contact via 76 is in direct electrical contact with the second p-type semiconducting layer 52. Accordingly, the third contact via 76 may be configured to form an Ohmic contact to a p-type layer. For example, the third contact via 76 may be a bi-layer electrical contact comprising a layer of Ni and a layer of Au; a layer of Ni and a layer of Ag. In some embodiments, the third contact 76 may comprise an indium tin oxide layer. Fourth contact vias 71, 72 are provided to make contact to the n-side of the second LED B1 via the n++ layer 40 of the tunnel junction. As such, each of the fourth contact vias 71, 72 may be configured to make contact to an n-type side of a semiconductor junction. For example, each of the first contact vias 71, 72 may comprise Al, or a bi-layer electrical contact comprising a layer of Ti and a layer of Al.

Figure 12:
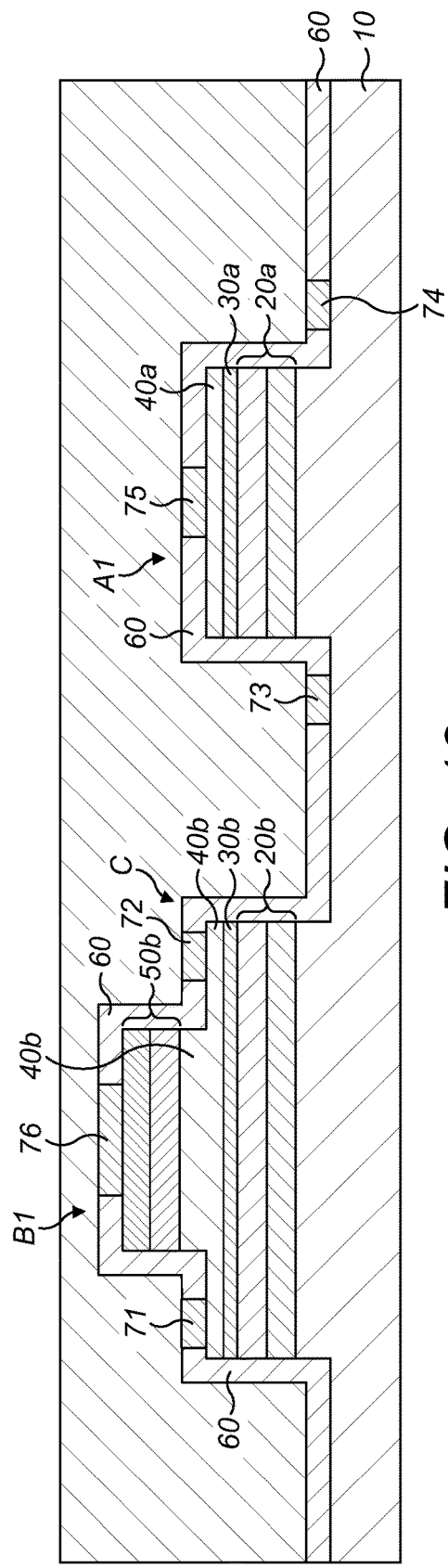
FIG. 12 shows a diagram of a LED array precursor including a gap filling contact.
Figure 13:
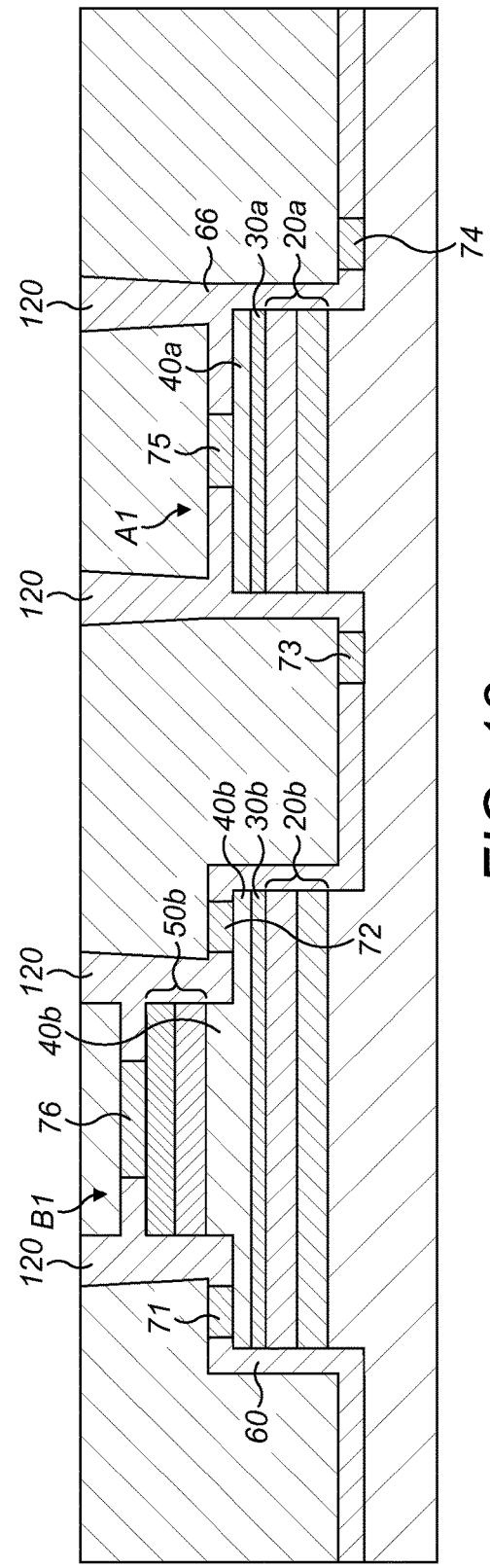
FIG. 13 shows a diagram of a LED array precursor including a gap filling contact and insulating spacers
Figure 14:
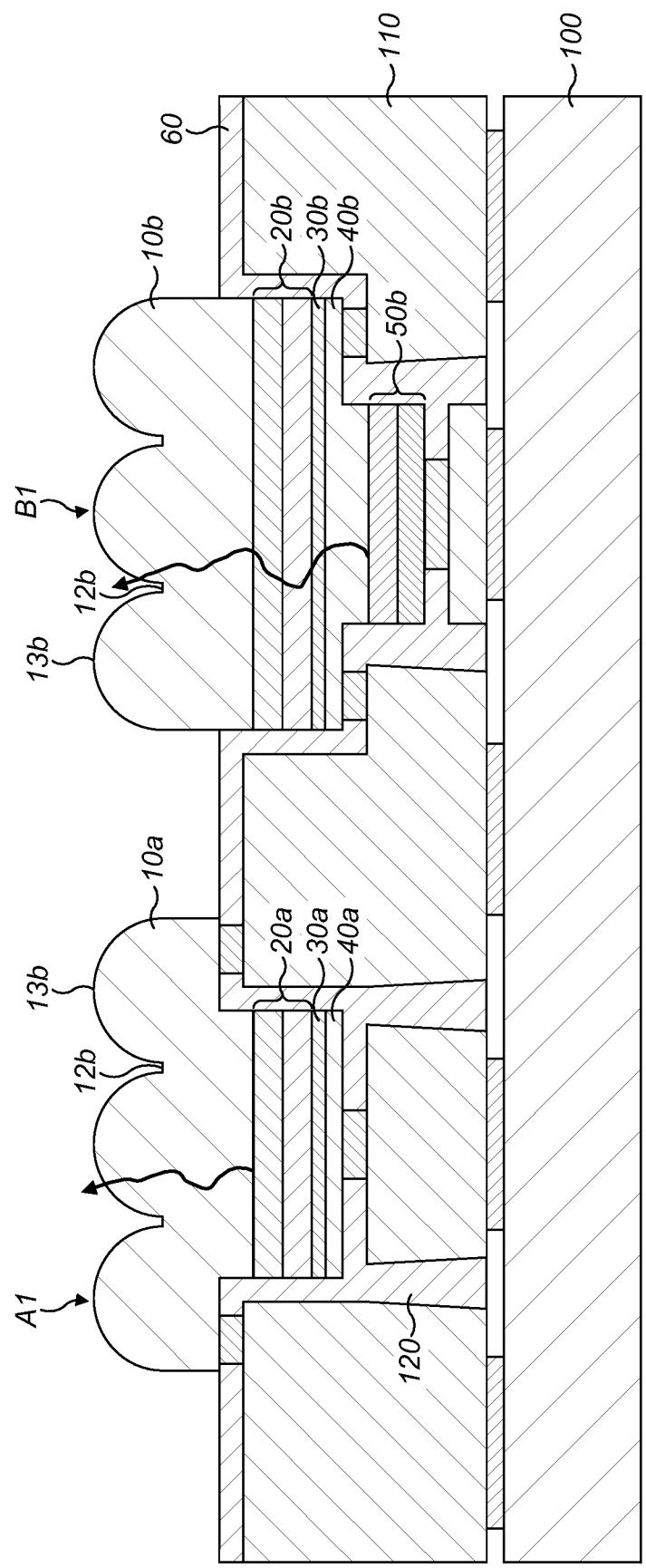
FIG. 14 shows a diagram of a LED array according to an embodiment of the disclosure.

In some embodiments, following the formation of contact vias, the LED array precursor may be bonded to a backplane electronics substrate 100. FIG. 12-14 shows diagrams of the formation of an LED array incorporating a backplane electronics substrate 100.

In FIG. 12, a gap filling contact layer 110 is formed over the LED array precursor. For example, in FIG. 12, the gap filling contact layer is provided over the LED array precursor including contact vias of FIG. 11. The gap filling contact layer comprises Al, Cu, or Au. The gap filling contact layer may be deposited by thermal or e-beam evaporation. The upper surface may subsequently be flattened (planarised) by a chemical mechanical polishing process. Alternatively, Cu gap-filling contacts may also be electroplated directly in pillar form.

In FIG. 13, portions of the gap filling contact layer are selectively removed and replaced with insulating spacers 120. The insulating spacers 120 are configured to electrically isolate the p and n side electrical contacts to each LED A1, B1 from each other. As such, the insulating spacers may be provided to encircle the p-side contacts of each LED (i.e. the second and third contact vias 75, 76). The n-side contacts (i.e. first and fourth contact vias 71, 72, 73, 74) may be provided with a common contact (a common cathode contact). The insulating spacers may comprise an electrically insulating material. For example, the insulating spacers may comprise the same material as the passivation layer 60. In the embodiment of FIG. 13, the insulating spacers comprise $SiO_2$.

In FIG. 14, the LED array of FIG. 13 is bonded to a backplane electronics substrate 100. The backplane electronics substrate 100 may comprises contact surfaces and control electronics configured to provide power to the first and second LEDs A1, B1. The gap filling contact layer 110 provides electrical contact between the contact vias 71, 72, 73, 74, 75, 76 and the backplane electronics substrate 100.

As shown in FIG. 14, the substrate 10 may also be subjected to further selective removal steps in order to pattern a light emitting surface 12a, 12b of the substrate 10. The light emitting surface 12a, 12b may be provided on an opposite side of the substrate 10 to the respective active layers 21, 51 of the first and second LEDs A1, B1. The light emitting surface 12a, 12b of the substrate may have one or more convex lens structures 13a, 13b formed in it by selective removal. As shown in FIG. 14, each of the first and second LEDs A1, B1 has three convex lens structures 13a, 13b formed in it. The convex lens structure may increase the light extraction efficiency of the LED.

In the embodiment of FIG. 14, the substrate 10 may also be subjected to a selective removal step to separate a portion of the substrate 10a on which the first LED A1 is provided from a portion of the substrate 10b on which the second LED is provided B1.

In some embodiments of the disclosure, the first and/or second active layer 22, 52 may be formed on a respective first or second strain relaxed layer 25, 55. As such, the first strain relaxed layer may be provided between the first active layer 22 and the substrate 10. The second strain relaxed layer 55 may be provided between the second active layer 52 and the n++ layer 40. The first strain relaxed layer 25 may be formed as part of the first LED stack 20. The second strain relaxed layer may be formed as part of the second LED stack 50. A strain relaxed layer 22, 52 may be provided in order to reduce a lattice mismatch between an in-plane lattice constant of the active layer 22, 52 and an in-plane lattice constant of structure on which the respective LED stack 20, 50 is to be formed. In particular, where the active layer is configured to generate light of a relatively long wavelength (e.g. wavelength in excess of 490 nm), a strain relaxed layer 22, 52 may be provided.

Figure 15:
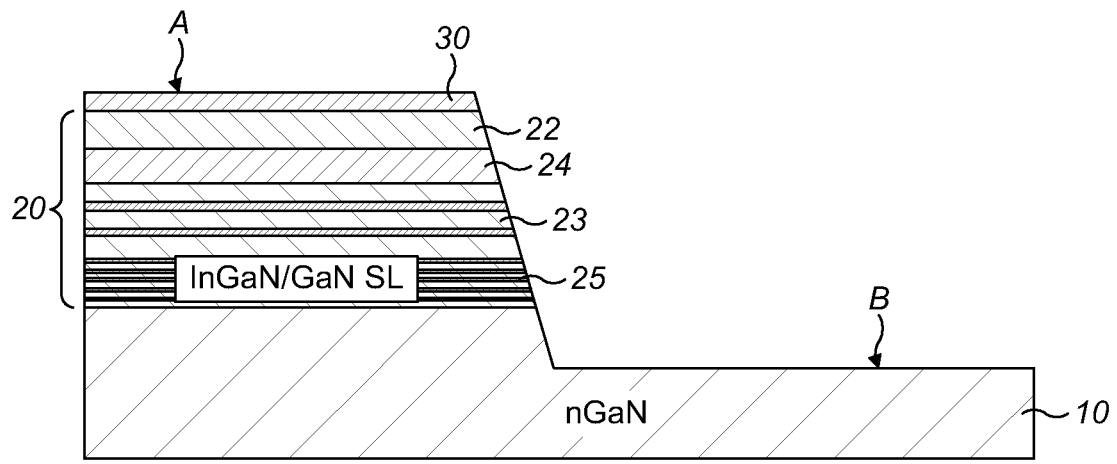
FIG. 15 shows a diagram of an intermediate step of a method in which a strain relaxing layer is provided.
Figure 16:
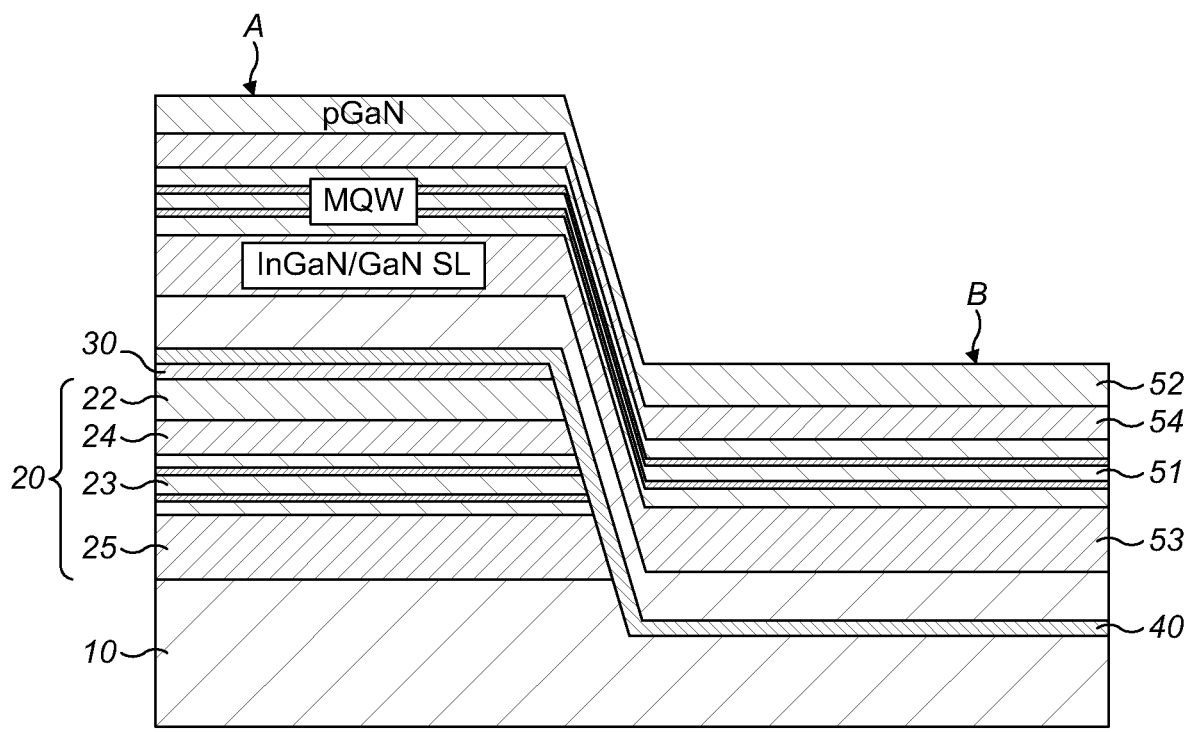
FIG. 16 shows a diagram of a further intermediate step of a method in which a strain relaxing layer is provided.

As shown in FIG. 15, the first strain relaxed layer 25 may be formed on the surface of the substrate 11. The first strain relaxed layer 25 comprises a Group III-nitride. The first strain relaxed layer 25 includes a first strain relaxing surface 26 on an opposite side of the first strain relaxed layer 25 to the substrate 10.

Accordingly, a LED array precursor may be provided in accordance with the embodiments discussed above. The LED array precursor provides a plurality of native LEDs which are formed monolithically on a substrate. As such, the methods of this disclosure provide a method of forming a plurality of different colour native LEDs monolithically on a substrate 10.

The invention claimed is:

1. A method of forming an LED array precursor comprising:
    forming a first LED stack on a substrate surface of a substrate, the first LED stack comprising a plurality of first Group III-nitride layers defining a first semiconductor junction configured to output light having a first wavelength, wherein a n-type side of the semiconductor junction is orientated towards to the substrate surface;
    forming a p++ layer on the first LED stack, the p++ layer comprising a Group III-nitride;
    selectively removing a portion of the first LED stack;
    forming a n++ layer over the substrate to cover the p++ layer, wherein a tunnel junction is formed at an interface between the n++ layer and the p++ layer, the n++ layer comprising a Group III-nitride;
    wherein the n++ layer is formed over the substrate surface such that a first portion of the n++ layer covers a first portion of the first LED stack provided on a first portion of the substrate surface and a second portion of the n++ layer covers a second portion of the substrate on which the first LED stack has been selectively removed;
    forming a second LED stack on the n++ layer; the second LED stack comprising a plurality of second Group III-nitride layers defining a second semiconductor junction configured to output light having a second wavelength different to the first wavelength, wherein a n-type side of the semiconductor junction is provided closest to the n++ layer,
    wherein the method further comprises a step of:
    selectively removing a portion of the second LED stack on the substrate surface in order to define:
    a first portion of the LED array in which the second LED stack is selectively removed comprising:
        the first portion of the first LED stack;
        a first portion of the p++ layer; and
        the first portion of the n++ layer such that a tunnel junction is provided on the first portion of the first LED stack; and
    a second portion of the LED array comprising:
        the second portion of the n++ layer; and
        a first portion of the second LED stack provided on the second portion of the n++ layer.

2. A method according to claim 1, wherein
the plurality of first Group III-nitride layers of the first LED stack comprises:
a first n-type layer provided on the substrate surface;
a first active layer configured to generate light having the first wavelength provided on the first n-type layer; and
a first p-type layer provided on the first active layer, and/or
the plurality of Group III-nitride layer of the second LED stack comprises:
a second n-type layer provided on the n++ layer;
a second active layer configured to generate the light having a second wavelength provided on the second n-type layer, wherein the second wavelength is different to the first wavelength; and
a second p-type layer provided on the second active layer.

3. A method according to any claim 2, wherein
the first active layer of the first LED stack comprises a first multiple quantum well laminate configured to output light of the first wavelength; and
the second active layer of the second LED stack comprises a second multiple quantum well laminate configured to output light of the second wavelength.

4. A method according to claim 3 wherein
the first multiple quantum well laminate comprises alternating layers of GaN and $In_XGa_{1-X}N$, where $0<X\leq1$;
the second multiple quantum well laminate comprises alternating layers of GaN and $In_YGa_{1-Y}N$, where $0<Y\leq1$.

5. A method according to claim 2, wherein
the first LED stack comprises a first electron blocking layer between the first active layer and the first p-type layer; and/or
the second LED stack comprises a second electron blocking layer between the second active layer and the second p-type layer.

6. A method according to claim 1, further comprising
selectively removing a portion of the first and second LED stacks to expose sidewall surfaces of the first and second LED stacks in order to defined a trench between the first portion of the LED array and the second portion of the LED array; and
depositing a passivation layer in the trench to cover the sidewall surfaces of the first and second LED stacks.

7. A method according to claim 1, wherein
the first LED stack is formed by a process at a first temperature; and
the second LED stack is formed by a process at a second temperature lower than the first temperature.

8. A method according to claim 1, wherein the second wavelength is longer than the first wavelength.

9. A method according to claim 1, wherein the steps of selectively removing portions of the first LED stack comprises:
selectively depositing a mask layer on portions of the first LED stack covering a first or second portion of the substrate surface; and
etching an exposed portion of the first LED stack to expose the second portion of the substrate below.

10. A method according to claim 1, wherein
the first wavelength is at least 380 nm and no greater than 480 nm; and/or
the second wavelength is at least 500 nm and no greater than 580 nm.

11. A method according to claim 1, wherein each portion of the LED array has surface dimensions on the substrate of less than 100 μm×100 μm.

12. A method according to claim 1, wherein
the n++ layer has a charge carrier density of at least $10^{19}$ cm$^{-3}$; and/or
the p++ layer has a charge carrier density of at least $10^{19}$ cm$^{-3}$.

13. A method according to any claim 1, wherein forming the n++ layer over the substrate to cover the p++ layer comprises:
forming an etch stop sublayer within the n++ layer, the etch stop sublayer comprising a Group III-nitride including Al.

14. A method according to claim 1, further comprising:
forming a first contact layer for the first portion of the LED array on the first portion of the n++ layer covering the first LED stack, and/or forming a second contact layer for the second portion of the LED array on the first portion of the second LED stack.

15. A method according to claim 14 wherein
the first contact layer comprises one or more of Ti, Al and Mo; and
the second contact layer comprises one or more of Ni, Pt, Au, and Indium Tin Oxide (ITO).

16. A method according to claim 1 wherein
a portion of the p++ layer is selectively removed along with the portion of the first LED stack to expose a second portion of the substrate surface.

17. A method according to claim 1, wherein
the second portion of the first LED stack is selectively removed to expose a second portion of the substrate surface before forming the p++ layer.

18. A Light Emitting Diode (LED) array precursor comprising:
a substrate having a substrate surface;
a first LED stack provided on a first portion of the substrate surface, the first LED stack comprising a plurality of first Group III-nitride layers defining a first semiconductor junction configured to output light having a first wavelength wherein a n-type side of the first semiconductor junction is orientated towards the substrate surface;
a p++ layer provided on the first LED stack, the p++ layer comprising a Group III-nitride;
a n++ layer having a first portion covering the p++ layer on the first LED stack and a second portion covering a second portion of the substrate surface, wherein a tunnel junction is formed at an interface between the n++ layer and the p++ layer, the n++ layer comprising a Group III-nitride; and
a second LED stack provided on the second portion of the n++ layer covering the second portion of the substrate surface, the second LED stack comprising a plurality of second Group III-nitride layers defining a second semiconductor junction configured to output light having a second wavelength different to the first wavelength, wherein a n-type side of the semiconductor junction is provided towards the n++ layer;
wherein the first portion of the n++ layer is provided on the first portion of the substrate surface, and the second portion of the n++ layer is provided directly on a second portion of the substrate surface.

19. A LED array according to claim 18 wherein
the plurality of first Group III-nitride layers of the first LED stack comprises:
a first n-type layer provided on the substrate surface;
a first active layer configured to generate light having a first wavelength provided on the first n-type layer; and
a first p-type layer provided on the first active layer;
a second n-type layer provided on the n++ layer;
the plurality of second Group III-nitride layers of the second LED stack comprises:
a second n-type layer provided on the n++ layer;
a second active layer configured to generate light having the second wavelength provided on the second n-type layer; and
a second p-type layer provided on the second active layer.

20. A LED array according to claim 18, wherein
a trench is provided between the first LED stack covering the first portion of the substrate surface and the second LED stack covering the second portion of the substrate, the trench defined by sidewall surfaces of the first and second LED stacks; and
a passivation layer is provided in the trench to cover the sidewall surfaces of the first and second LED stacks.

21. A LED array according to claim 18, further comprising:
a first contact layer provided on the first portion of the n++ layer covering the first LED stack, and/or a second contact layer provided on the second LED stack.

22. A method according to claim 21 wherein
the first contact layer comprises one or more of Ti, Al and Mo; and
the second contact layer comprises one or more of Ni, Pt, Au, and Indium Tin Oxide (ITO).

23. A LED array according to claim 21, wherein
a first adhesion layer is provided between the second n-type layer covering the first LED stack and the first contact layer, and/or a second adhesion layer is provided between the second contact layer provided and the second p-type layer of the second LED stack.

24. A LED array according to claim 18, wherein the n++ layer comprises an etch stop sublayer within the n++ layer, the etch stop sublayer comprising a Group III-nitride including Al.

* * * * *